(12) United States Patent
Johnson

(10) Patent No.: US 7,373,619 B2
(45) Date of Patent: May 13, 2008

(54) POST-SILICON TEST COVERAGE VERIFICATION

(75) Inventor: Tyler James Johnson, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1063 days.

(21) Appl. No.: 10/453,103

(22) Filed: Jun. 3, 2003

(65) Prior Publication Data

US 2004/0225973 A1 Nov. 11, 2004

Related U.S. Application Data

(60) Provisional application No. 60/469,575, filed on May 10, 2003.

(51) Int. Cl.
G06F 17/50 (2006.01)
(52) U.S. Cl. ............................................. 716/4; 716/16
(58) Field of Classification Search .................... 716/4, 716/5, 6, 16
See application file for complete search history.

(56) References Cited

U.S. PATENT DOCUMENTS

| 6,594,816 | B1* | 7/2003 | Hauck | 716/18 |
| 2001/0010091 | A1* | 7/2001 | Noy | 716/4 |
| 2002/0002698 | A1* | 1/2002 | Hekmatpour | 716/4 |
| 2003/0121011 | A1* | 6/2003 | Carter | 716/4 |
| 2003/0182642 | A1* | 9/2003 | Schubert et al. | 716/4 |
| 2004/0204912 | A1* | 10/2004 | Nejedlo et al. | 702/188 |

OTHER PUBLICATIONS

Bart Vermeulen and Sandeep Kumar Goel, "Design for Debug: Catching Design Errors in Digital Chips", IEEE Design & Test of Computers; May-Jun. 2002; pp. 37-45.

* cited by examiner

*Primary Examiner*—Jack Chiang
*Assistant Examiner*—Magid Y. Dimyan

(57) ABSTRACT

In one embodiment, the invention is directed to a method of optimizing post-silicon test coverage for a system under test ("SUT"). The method comprises defining coverage data comprising Hardware Description Language ("HDL") events; testing the SUT using a system exerciser connected to the SUT; comparing the results of the testing with the coverage data to identify underutilized areas of functionality of the SUT; and responsive to the comparing operation, performing additional tests.

25 Claims, 5 Drawing Sheets

POST-SILICON TEST COVERAGE VERIFICATION

PRIORITY UNDER 35 U.S.C. §119(e) & 37 C.F.R. §1.78

This nonprovisional application claims priority based upon the following prior United States provisional patent application entitled: "Post-Silicon Test Coverage Verification," Application No. 60/469,575, filed May 10, 2003, in the name(s) of Tyler J. Johnson, which is hereby incorporated by reference.

CROSS-REFERENCE TO RELATED APPLICATIONS

This application is related to U.S. patent application Ser. No. 10/402,092, filed Mar. 28, 2003, entitled A BUS INTERFACE MODULE; U.S. patent application Ser. No. 10/402,628, filed Mar. 28, 2003, entitled SYSTEM AND METHOD FOR USING A DEBUG BUS AS A CAPTURE BUFFER; U.S. patent application Ser. No. 10/402,122, filed Mar. 28, 2003, entitled SYSTEM AND METHOD FOR VERIFYING HDL EVENTS; U.S. Patent Application Ser. No. 60/469,168, filed May 9, 2003, entitled GENERAL PURPOSE DELAY LOGIC; U.S. patent application Ser. No. 10/453,720 filed Jun. 3, 2003, entitled SYSTEM AND METHOD FOR PARSING HDL EVENTS FOR OBSERVABILTTY; and U.S. patent application Ser. No. 10/402,034, filed Mar. 28, 2003, entitled AN INTEGRATED CIRCUIT, all of which are hereby incorporated by reference in their entirety.

BACKGROUND

The increasing complexity of system designs, increased investment required due to this complexity, and shortened product cycles have presented significant challenges to post-silicon design verification of chipsets. This is especially true with respect to high-end cache coherent non-uniform memory access ("ccNUMA") chipsets where systems can be extremely large and complex. Processor post-silicon verification is typically focused on electrical verification at least as much as functional verification due to the large amount of full custom design. Chipsets present a different challenge due to the large number of cells of which they are comprised. Additionally, due to the sheer number of buses, internal bus arbitration, cache coherency control, queue arbitration, etc., in a large ccNUMA server, post-silicon functional verification of such a chipset consumes a greater amount of resources with respect to electrical verification than processors typically consume. Internal observability, while relatively simple in pre-silicon verification, poses a major obstacle to debug and functional test coverage.

Determining when system verification is complete is a second major obstacle to completing post-silicon verification in a time-effective manner. While pre-silicon simulation-based testing depends significantly on labor intensive directed and pseudo-random testing, post-silicon testing has historically depended on observing system operations that imply correct behavior. In addition to external interface monitoring, enhanced internal observability via Real-Time-Observabilty ("RTO") features, such as those described in the above-referenced related patent applications, facilitates monitoring of internal state that provides active confirmation of coverage of the design space.

As a result of having this increased internal observability, more pre-silicon design data and metrics can be leveraged improving schedule and reducing resource consumption. It is known that verification is complete when criteria derived from pre-silicon data is observed in silicon.

Performing post-silicon design verification is an industry standard practice that helps expose bugs not usually found in pre-silicon verification Typical post-silicon bugs discovered include those that are manifested after long or at-speed operation of the system, bugs due to incorrect modeling of the hardware and firmware interfaces, bugs due to RTL errors that escaped pre-silicon detection and bugs due to incorrect mapping of RTL to silicon (synthesis/physical bugs).

Accepted ways in which to exercise systems in order to expose post-silicon bugs include running operating systems and software applications targeted for the final system, creating specific directed software tests that stress different portions of the system, and running software tests that create random system operations. In the process of performing post-silicon verification of a large chipset, all of these standard exercise methods may be used to test the chipset in various functional areas, including: (1) ensuring that correct packet operations are observed on all major interfaces, including, for example, processor, intra-chip, and IO interfaces; (2) ensuring that system performance and system latencies are measured in the actual systems, wherein both directed tests and bench marking applications are used for these measurements; (3) ensuring that the system responds properly to errors, including fatal error conditions, injected into the system; (4) ensuring extended system operation under directed and random exercises produces correct behavior; (5) ensuring operating system and applications perform correctly; and (6) ensuring system configurations (e.g., processors, memory, I/O, platforms) perform correctly.

While internal signal observability features have been available in some FPGA architectures and ASICs, they have been of very limited scope. Typically, such limited internal observability features have not been used for functional test coverage. The primary objective of post-silicon verification is to test a chipset such that all of its internal functionality and product configurations are completely exercised and no faults are observed to occur, supporting correct operations for end users.

SUMMARY

In one embodiment, the invention is directed to a method of optimizing post-silicon test coverage for a system under test ("SUT"). The method comprises defining coverage data comprising Hardware Description Language ("HDL") events; testing the SUT using a system exerciser connected to the SUT; comparing the results of the testing with the coverage data to identify underutilized areas of functionality of the SUT; and responsive to the comparing operation, performing additional tests.

DETAILED DESCRIPTION OF THE DRAWINGS

Figure 1:
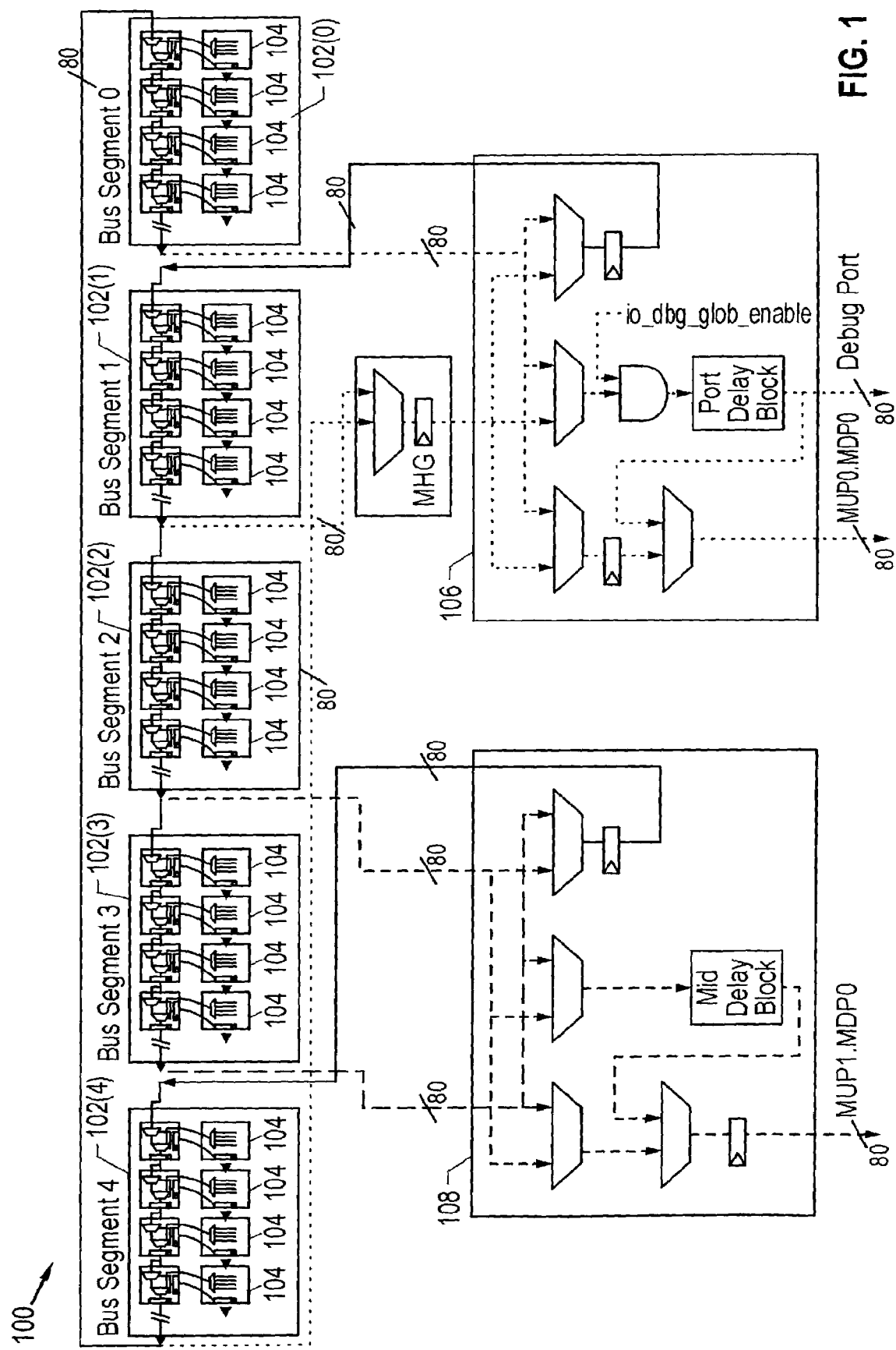
FIG. 1 is a block diagram of a debug bus of one embodiment.

In the drawings, like or similar elements are designated with identical reference numerals throughout the several views thereof, and the various elements depicted are not necessarily drawn to scale.

As illustrated in FIG. 1, in accordance with one embodiment, a debug bus 100 comprises a plurality of bus segments 102(0)-102(4) interconnected in a serial ring and runs at the core clock speed of an IC, e.g., an ASIC, in which the bus is implemented. In one implementation, the debug bus 100 is 80-bits wide; however, in general, the width of the debug bus is consistent with device pin constraints. Moreover, although the illustrated embodiment employs only five bus segments 102(0)-102(4), it will be appreciated that greater or fewer than five bus segments may be implemented as necessary for providing appropriate logical and physical partitioning.

Each bus segment 102(0)-102(4) comprises several access points 104 at which data from surrounding logic is MUXed onto the debug bus 100. As will be described in greater detail below with reference to FIGS. 3 and 4, each access point 104 comprises a standard logic block with a proprietary MUX structure that drives debug data into the access point, which subsequently drives the data onto the debug bus 100.

As illustrated in FIG. 1, two observability ports 106, 108 are defined. In one embodiment, one of the ports, i.e., port 106, is a dedicated debug port. The other port, i.e., port 108, is loaded with functional signals. The debug bus 100 contains debug data that drives both of these ports 106, 108. In one embodiment, the debug port 106 has 80 data pins, plus four strobe pins that are single pumped, with the intention that the port 106 be connected directly to a logic analyzer (not shown).

As previously indicated, the debug port 106 is fed directly from the debug bus 100, which runs at core clock speed and connects the bus segments 106 in a serial ring. The debug bus 100 is segmented so that for any of a plurality of functional areas of an IC in which the bus is implemented, packets to and from the area can be observed in addition to 80 bits of internal state data. Additional details regarding implementation and operation of the debug bus 100 and ports 102, 104 are provided in commonly-assigned, co-pending U.S. patent application Ser. No. 10/402,034, filed Mar. 28, 2003, entitled AN INTEGRATED CIRCUIT, which has been incorporated by reference in its entirety hereinabove.

Figure 2:
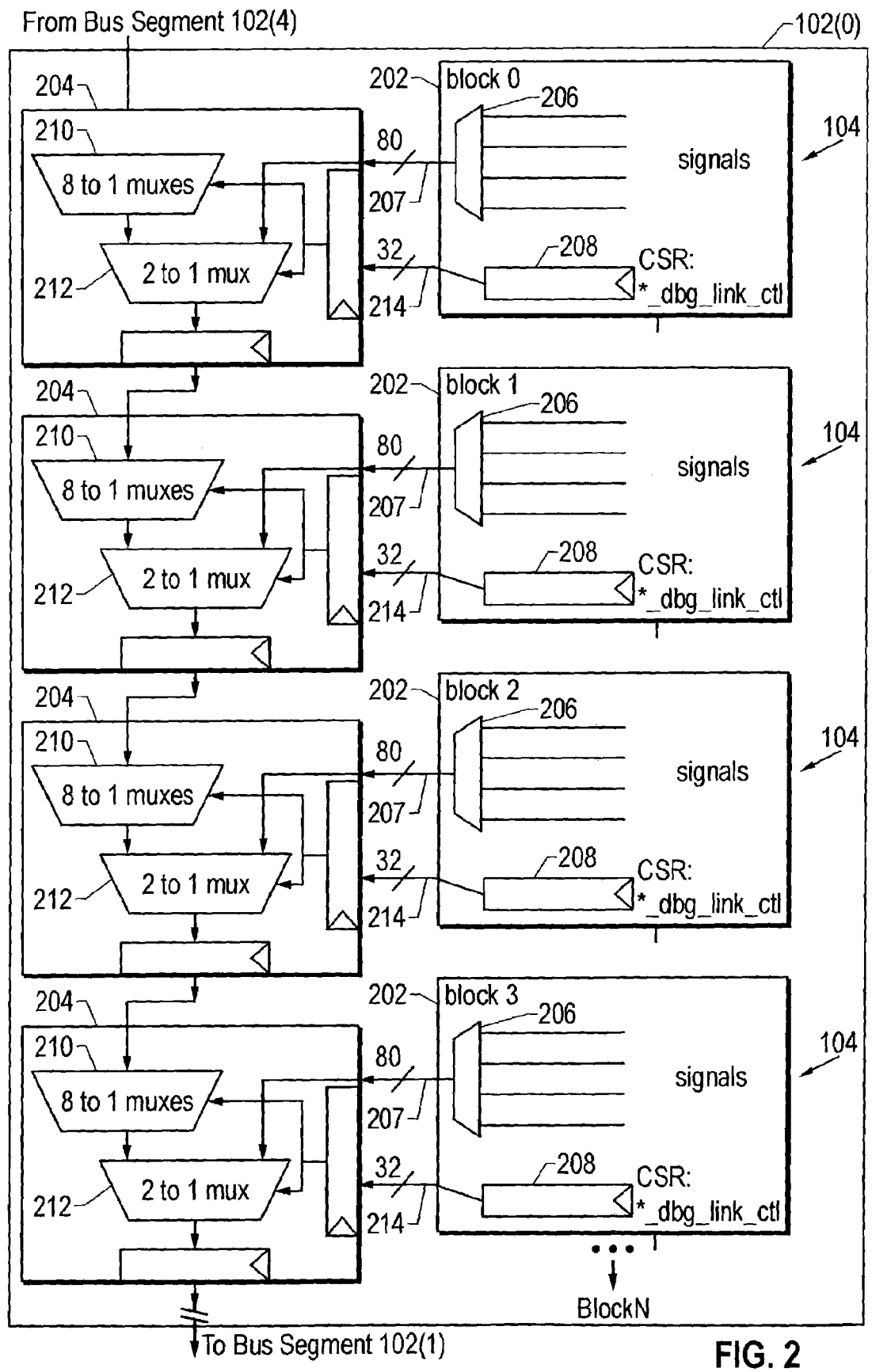
FIG. 2 is a block diagram of a bus segment of the debug bus of FIG. 1.

FIG. 2 is a more detailed block diagram of the bus segment 102(0) of the debug bus 100 illustrated in FIG. 1. As illustrated in FIG. 2, the bus segment 102(0) includes a plurality of access points 104. It should be noted that although only four access points 104 are shown, each bus segment 102(0)-102(4) may comprise greater or fewer access points as necessitated by the number of signals that must be handled by the bus segment.

As shown in FIG. 2, each access point 104 includes a local data intake section 202 and a corresponding debug bus interface block ("DBIB"), or Bus Interface Module, 204 connected thereto. At each access point 104, up to 80 bits of data from surrounding logic ("dbug_read_bus") is provided to the DBIB 204 thereof via a MUX 206 along a bus 207. A control and status register ("CSR") 208 provides a 32-bit MUX select signal ("*_dbg_link_ctl") to MUXes 210, 212, of the corresponding DBIB 204 for purposes that will be described in greater detail below via a bus 214.

Figure 3:
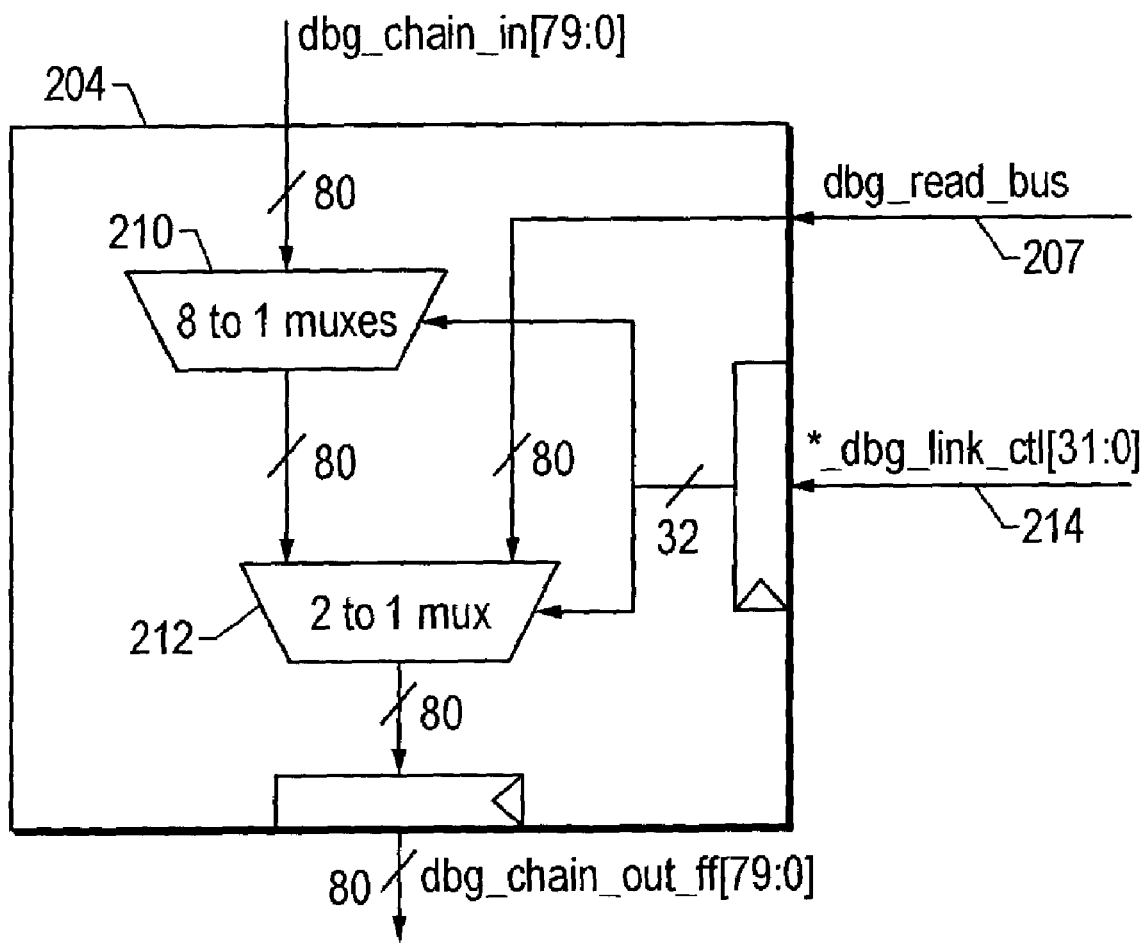
FIG. 3 is a block diagram of a standard logic block used to implement the bus segment of FIG. 2.

FIG. 3 is a more detailed block diagram of one of the DBIBs 204 of FIG. 2. In one embodiment, the debug bus 100 is logically divided into eight 10-bit blocks. Each DBIB 204 can move and/or replicate incoming debug bus data ("dbg_chain_in") from the previous DBIB in the chain in these 10-bit blocks to make room for incoming data ("dbg_read_bus") from the corresponding local data intake section 202, if necessary, and pass the newly configured data ("dbg_chain_out") to the next DBIB 204 in the chain. Generally, each DBIB 204 performs the following three functions: (1) it passes data on from the previous access point, (2) it moves 10-bit blocks of data from the previous access point to other ranges of the debug bus, allowing for more efficient bandwidth utilization; and (3) it MUXes in data from surrounding logic in 10-bit chunks.

As previously indicated, to make MUXing of data manageable, the debug bus 100 is logically divided into eight 10-bit blocks, each of which can be individually manipulated. Further, each access point 104 registers data from the previous access point, rearranges the data from previous access point in 10-bit blocks as specified by the corresponding CSR control signal("*_dbg_link_ctl"), and MUXes in local data to be passed on to the next access point. Accordingly, the *_dbg_link_control signal functions as a MUX select signal.

In accordance with features of one embodiment, an HDL event is defined that contains a functional signal name, a MUX select configuration required to see the functional signal at the observability port 106 (FIG. 1), and the bit position of the functional signal on the observability port. An exemplary event macro for defining such an event, designated "EVENT_DBG_C", is set forth below: EVENT_DBG_C(<ck>,<mux_sel>,<constant>,<signal_name>,<offset>,<slot>, <event ID>);

| EVENT MACRO | |
|---|---|
| <ck> | The core clock. |
| <mux_sel> | The bits in *_dbg_link_ctl required to enable the signal identified by <signal_name>. This field can be 1 to 64 bits. This will be a variable. |
| <constant> | When <mux_sel>=<constant>, the event triggers. This field is also 1 to 64 bits. This will be a constant. Include everything that is not a "don't care", including zeros. |
| <signal_name> | The signal (variable) going to the debug bus. Do not zero fill. The field of the signal identified by <signal_name> must be aligned to a block boundary (unless a non-zero <offset> is specified) Signals that span multiple blocks are OK, but the blocks must be contiguous and enabled by the same MUX select bits. |
| <offset> | The offset from a 10-bit block boundary (hex value 0 to 9) of the signal identified by <signal_name>. Most signals should be aligned on a 10-bit block boundary and therefore have a 0 in this field. |
| <slot> | An 8-bit mask that indicates what block or blocks are written to for the signal identified by <signal_name> (constant). Blocks must be contiguous. |
| <event_ID> | The event ID. This MUST BE absolutely unique. Use of block as a prefix (e.g., pin_dbg_block0) is suggested. |

Figure 4:
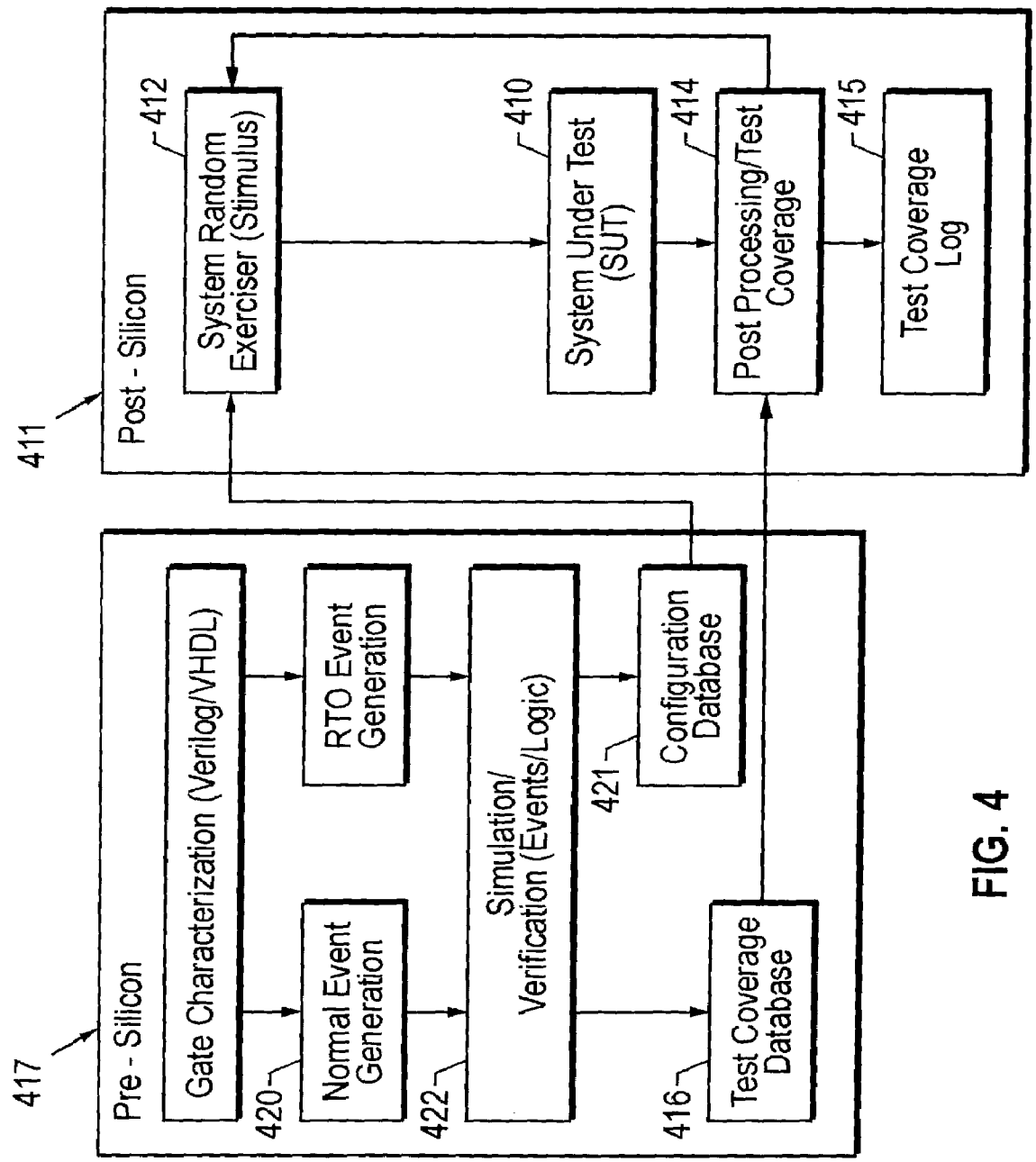
FIG. 4 is a system block diagram and flow diagram of pre- and post-silicon phase operations related to one embodiment.

The primary objective of post-silicon verification is simply to test an IC or chipset such that all of its internal functionality and product configurations have been completely exercised and no faults have been observed to occur, supporting correct operation for end users. As illustrated in FIG. 4, both design information necessary for configuring the RTO infrastructure (i.e., the debug bus 100) and the verification data enumerating the critical functionality for post-silicon functional test coverage may be obtained from pre-silicon design verification efforts. By extracting RTO infrastructure configuration information directly from pre-silicon events, data is extremely accurate because MUX configurations can be easily verified with simulations. A method for performing this function is described in U.S. patent application Ser. No. 10/453,720, filed Jun. 3, 2003, entitled SYSTEM AND METHOD FOR PARSING HDL EVENTS FOR OBSERVABILITY. In addition, the process lent itself to RTO automation when used for root cause analysis as well as functional test coverage.

It will be recognized that automation scripts and other data analysis tools for automating both the collection and interpretation of data (post-processing) facilitate post-silicon functional test coverage, although these tasks may be performed manually.

Referring now to FIG. 4, to test an IC, or chipset, hereinafter referred to as a "System Under Test" or "SUT" 410, during a post-silicon phase 411, system exercisers 412, which may include, for example, a random exerciser, a directed test generator and/or operating system stress tools, are applied to the SUT 410 in a variety of hardware configurations. In a post processing/test coverage stage 414, test coverage data is logged one or more logs 415, post-processed, and compared against predefined coverage data stored in a test coverage database 416 that is defined in a pre-silicon phase 417. This comparison enables identification of underutilized areas of functionality of the SUT 410.

As underutilized areas are identified, the system random exercisers 412 are modified and directed tests are written to stress those underutilized areas, thus achieving more comprehensive SUT 410 test coverage than purely random testing alone will accomplish.

As previously indicated, during gate characterization 418 in the pre-silicon phase 417, HDL events 420 are embedded in HDL code defining a system design and enable the fact that a certain state in a state machine has been reached or that some logic has reached a certain condition to be indicated. Accordingly, HDL events are defined in HDL code defining a system and, during system simulation and verification 422, if the defined condition is "hit", then it is known that the case that the defined condition represents in terms of system coverage has been covered.

In accordance with one embodiment, pre-silicon data is extended for use in determining and ensuring post-silicon test coverage. In particular, predefined coverage data 416 comprises events identifying "corner cases" in state, or design, space.

Figure 5:
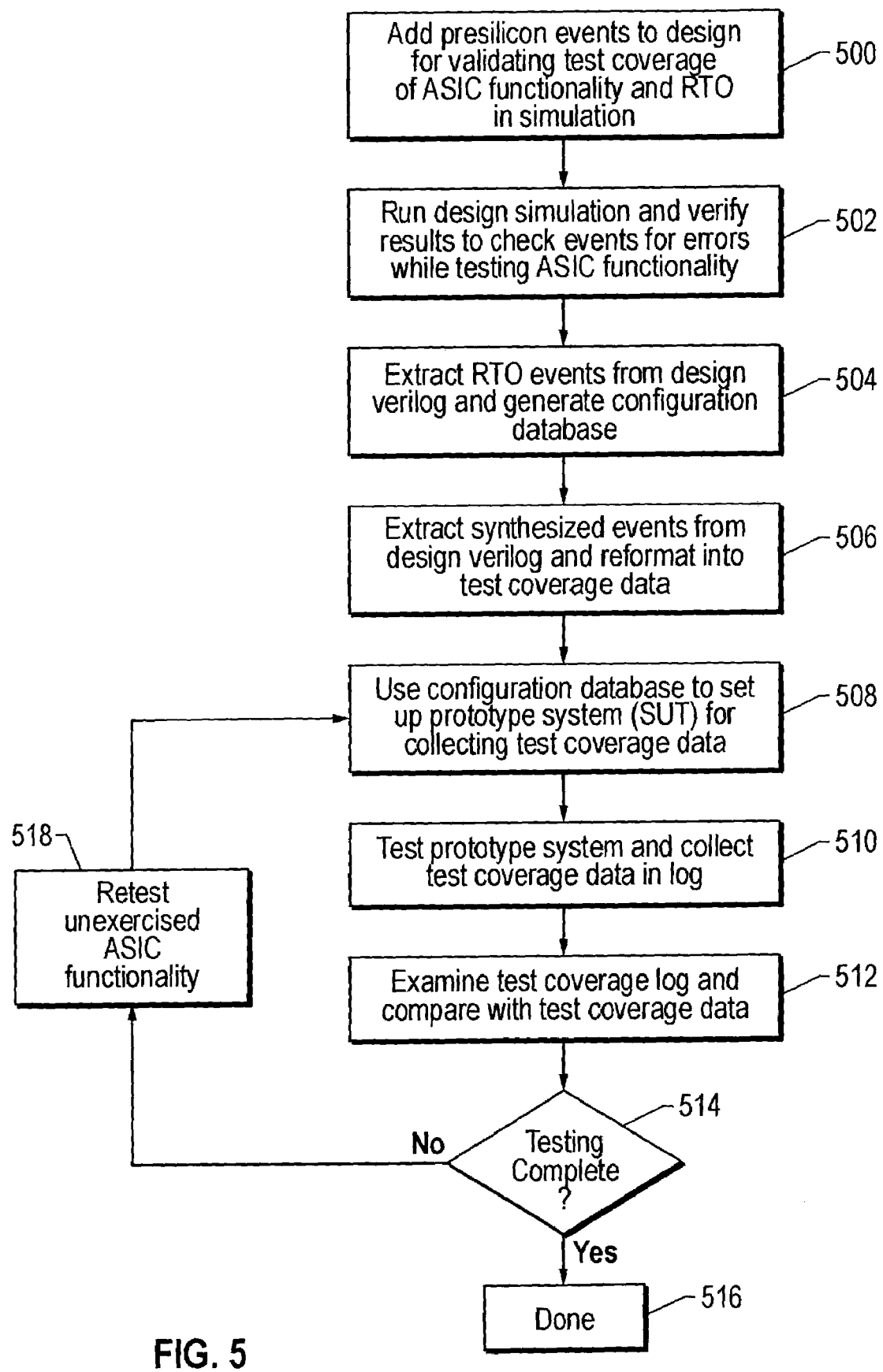
FIG. 5 is a flowchart of the operation of one embodiment for implementing post-silicon test coverage.

FIG. 5 is a flowchart of the operation of one embodiment for implementing post-silicon test coverage. In step 500, presilicon events are added to the design of the ASIC for validating test coverage of general ASIC functionality, as well as RTO in simulation. In step 502, design simulations are run and the results are verified to check events for errors while testing general ASIC functionality. Additional details as to the performance of this step are provided in U.S. patent application Ser. No. 10/402,122, filed Mar. 28, 2003, entitled SYSTEM AND METHOD FOR VERIFYING HDL EVENTS. In step 504, RTO events are extracted from the design Verilog and observability bus setup information is taken and reformatted to be used in configuring the observabilty bus and other RTO structures. This data is used to generate a configuration database 421 (FIG. 4), as described in U.S. patent application Ser. No. 10/453,720, filed Jun. 3, 2003 entitled SYSTEM AND METHOD FOR PARSING HDL EVENTS FOR OBSERVABILITY.

In step 506, events that have been synthesized are extracted from the design Verilog and reformatted into the test coverage database 416 (FIG. 4) containing the states that need to be tested. The data in the test coverage database is correlated to the configuration database 421. In step 508, on a prototype system (e.g., the SUT 410), the configuration database 421 is used to set up the system for collecting test coverage data based on what has not been tested from the test coverage database 416. In step 510, the prototype system is run using the system exercisers 412 while test coverage data is extracted and logged in the test coverage log 415. If necessary, the system exercisers 412 can be modified to try to cover functionality missed in any previous runs. In step 512, the test coverage logs are examined, either manually or using a program, and compared with the test coverage database 416. In step 514, a determination is made whether testing has been completed; that is, whether all of the functionality described in the test coverage database has been exercised. If so, execution terminates in step 516; otherwise, execution proceeds to step 518. In step 518, functionality that was not exercised is retested and execution returns to step 508.

An implementation of the invention described herein thus provides an architecture topology for enabling real-time observability in an IC. The embodiments shown and described have been characterized as being illustrative only; it should therefore be readily understood that various changes and modifications could be made therein without departing from the scope of the present invention as set forth in the following claims. For example, while the embodiments are described with reference to an ASIC, it will be appreciated that the embodiments may be implemented in other types of ICs, such as custom chipsets, Field Programmable Gate Arrays ("FPGAs"), programmable logic devices ("PLDs"), generic array logic ("GAL") modules, and the like. Furthermore, while the embodiments shown are implemented using CSRs, it will be appreciated that control signals may also be applied in a variety of other manners, including, for example, directly or may be applied via scan registers or Model Specific Registers ("MSRs").

Accordingly, all such modifications, extensions, variations, amendments, additions, deletions, combinations, and the like are deemed to be within the ambit of the present invention whose scope is defined solely by the claims set forth hereinbelow.

What is claimed is:

1. A method of optimizing post-silicon test coverage for a system under test ("SUT"), the method comprising:
    defining coverage data comprising Hardware Description Language ("HDL") events;
    configuring the SUT using configuration data collected from an observability debug bus associated with the SUT;
    testing the SUT using a system exerciser connected to the SUT; and
    comparing the results of the testing with the coverage data to identify underutilized areas of functionality of the SUT.

2. The method of claim 1 wherein the coverage data defines a plurality of corner cases in a state space of the SUT.

3. The method of claim 1 wherein the defining operation is performed during a pre-silicon phase of development of the SUT.

4. The method of claim 1 wherein the results of the testing are written to a log file.

5. The method of claim 1 wherein the testing is performed by a system exerciser.

6. The method of claim 5 wherein the system exerciser comprises a random exerciser.

7. The method of claim 5 wherein the system exerciser comprises a directed test generator.

8. The method of claim 5 wherein the system exerciser comprises one or more operating system stress tools.

9. The method of claim 1 further comprising: responsive to the comparing, performing additional tests, wherein the additional tests comprise directed tests designed specifically to test the identified underutilized areas.

10. Apparatus for optimizing post-silicon test coverage for a system under test ("SUT"), the apparatus comprising:
    means for defining coverage data comprising Hardware Description Language ("HDL") events;
    means for configuring the SUT using configuration data collected from an observability debug bus associated with the SUT;
    means for testing the SUT using a system exerciser connected to the SUT; and
    means for comparing the results of the testing with the coverage data to identify underutilized areas of functionality of the SUT.

11. The apparatus of claim 10 wherein the coverage data defines a plurality of corner cases in a state space of the SUT.

12. The apparatus of claim 10 wherein the results of the testing are written to a log file.

13. The apparatus of claim 10 wherein the means for testing comprises a system exerciser.

14. The apparatus of claim 13 wherein the system exerciser comprises a random exerciser.

15. The apparatus of claim 13 wherein the system exerciser comprises a directed test generator.

16. The apparatus of claim 13 wherein the system exerciser comprises one or more operating system stress tools.

17. The apparatus of claim 10 further comprises means operable responsive to the results for performing additional tests, wherein the additional tests comprise directed tests designed specifically to test the identified underutilized areas.

18. Apparatus for optimizing post-silicon test coverage of a system under test ("SUT"), the apparatus comprising:
    a coverage data structure comprising Hardware Description Language ("HDL") events;
    a configuration data structure comprising configuration data collected from an observability bus associated with the SUT, the configuration data operable to configure the SUT with respect to testing;
    a system exerciser connected to the SUT for testing the SUT; and
    logic for comparing the results of the testing with the coverage data to identify underutilized areas of functionality of the SUT.

19. The apparatus of claim 18 wherein the coverage data defines a plurality of corner cases in a state space of the SUT.

20. The apparatus of claim 18 wherein the system exerciser comprises a random exerciser.

21. The apparatus of claim 18 wherein the system exerciser comprises a directed test generator.

22. The apparatus of claim 18 wherein the system exerciser comprises one or more operating system stress tools.

23. The apparatus of claim 18 wherein the system exerciser is operable to perform additional tests responsive to the results, the additional tests comprising directed tests designed specifically to test the identified underutilized areas.

24. The apparatus of claim 18 wherein the SUT comprises an application specific integrated circuit ("ASIC").

25. The apparatus of claim 18 wherein the SUT comprises a system selected from at least one of a field programmable gate array ("FPGA"), a programmable logic device ("PLD"), and a generic array logic ("GAL") module.

* * * * *